United States Patent [19]

Current

[11] 4,378,595
[45] Mar. 29, 1983

[54] SYNCHRONOUS MULTIVALUED LATCH

[75] Inventor: Karl W. Current, Davis, Calif.

[73] Assignee: The Regents of the University of California, Berkeley, Calif.

[21] Appl. No.: 133,835

[22] Filed: Mar. 25, 1980

[51] Int. Cl.³ .................. G11C 11/56; G11C 27/00
[52] U.S. Cl. ................................. 365/45; 365/168
[58] Field of Search ..................... 365/168, 45, 73

[56] References Cited

U.S. PATENT DOCUMENTS

| | | | |
|---|---|---|---|
| 3,249,925 | 5/1966 | Single et al. | 365/45 |
| 3,512,140 | 5/1970 | Yokozawa et al. | 365/45 |
| 3,706,978 | 12/1972 | Dalley et al. | 365/156 |
| 4,006,469 | 2/1977 | Leehan et al. | 365/154 |
| 4,057,788 | 11/1977 | Sage | 365/174 |
| 4,122,548 | 10/1978 | Heuber et al. | 365/203 |
| 4,175,290 | 11/1979 | Harari | 365/156 |
| 4,181,865 | 1/1980 | Kohyama | 365/45 |

OTHER PUBLICATIONS

Smith, "Circuits for Multiple Valued Logic", 1976 International Symposium on Multiple Valued Logic Proceedings, pp. 30-43.
Current et al., "Four-Valued Threshold Logic Full Adder Circuit Implementations", 1978 International Symposium on Multivalued Logic, 5/78, pp. ISMVL-1 to 6.

*Primary Examiner*—Stuart N. Hecker
*Attorney, Agent, or Firm*—Phillips, Moore, Weissenberger, Lempio & Majestic

[57] ABSTRACT

A synchronous multivalued latch for storing logical current values of input current having any one of a plurality of multivalues, including a quantizer for receiving current, for generating a logical current being a quantization of the received current, and for regenerating the received current from the logical current as an output, an input line for directing the input current to the quantizer as the received current, a feedback line for directing the regenerated current back to the quantizer as the received current, and a clock controlled switching device for coupling the input line to the quantizer while decoupling the feedback line from the quantizer during a setup mode and for decoupling the input line from the quantizer while coupling the feedback line to the quantizer during a hold mode.

10 Claims, 3 Drawing Figures

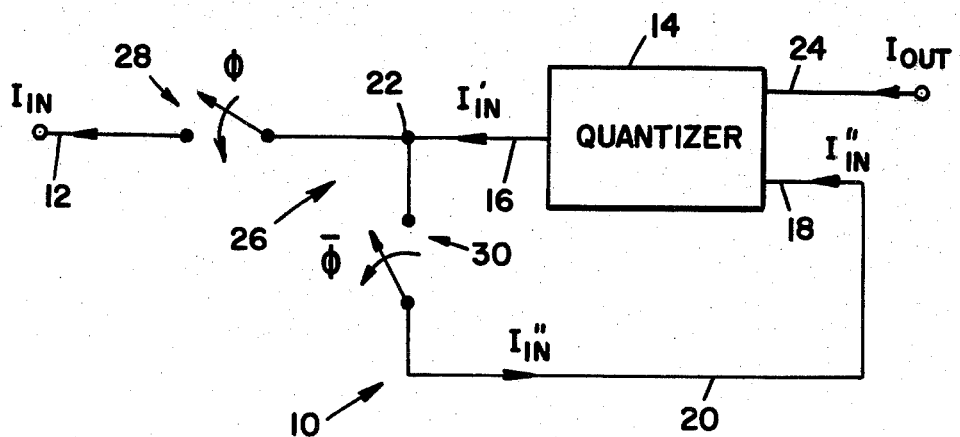
FIG_1
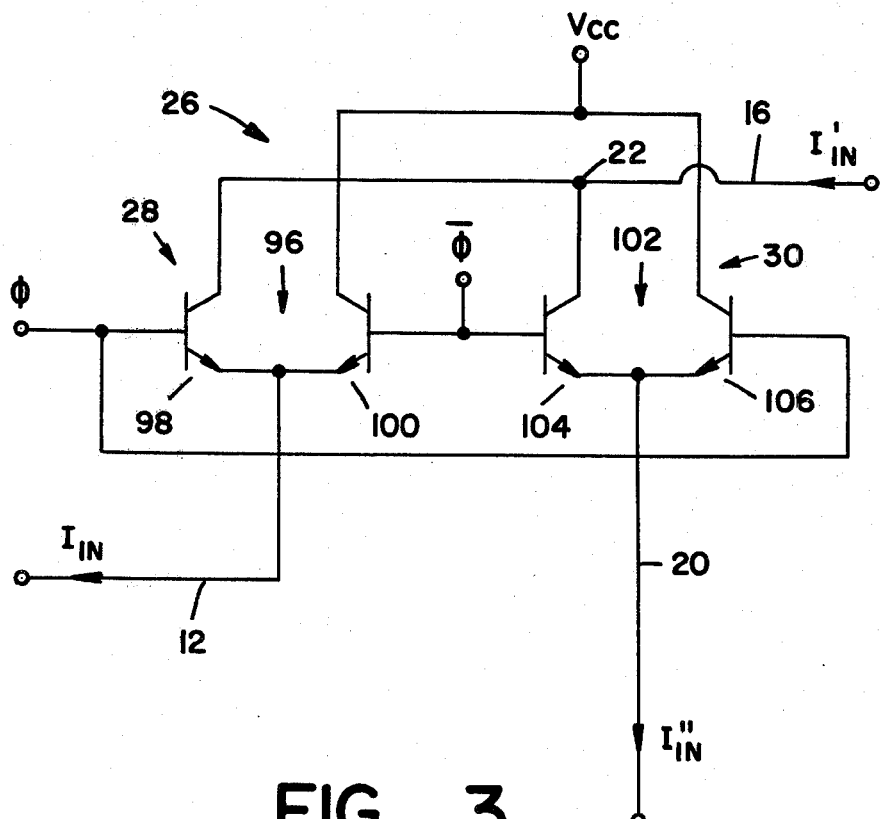
FIG_3

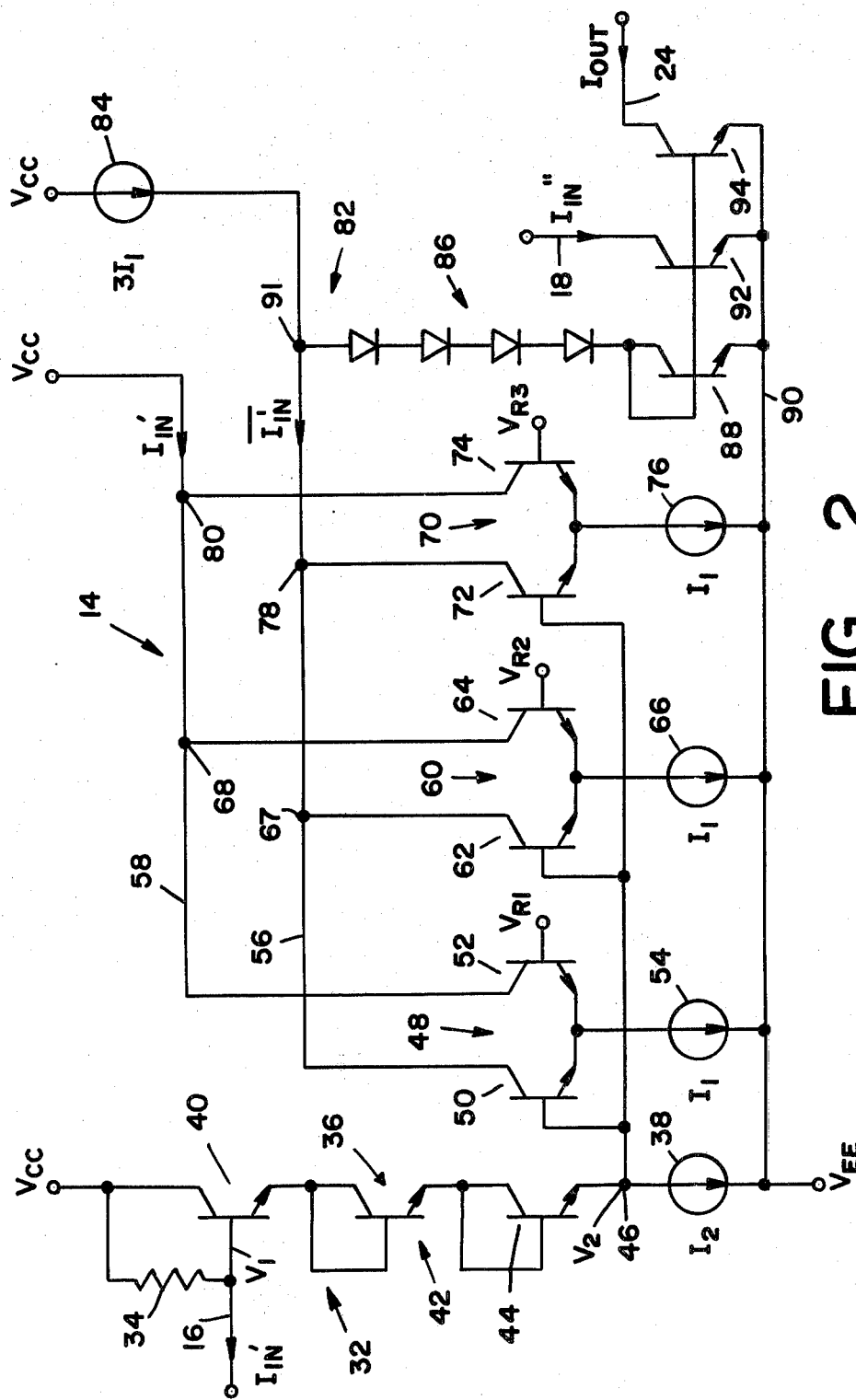
FIG_2

SYNCHRONOUS MULTIVALUED LATCH

DESCRIPTION

Background Art

This invention relates generally to a memory element and more particularly to a synchronous multivalued latch.

Digital signal processing circuits are being implemented as large-scale-integrated (LSI) circuits on chips by using conventional photomasking and silicon surface processing technology. The size and complexity of some LSI circuits have grown to the extent that this conventional technology is a limitation on the ability to integrate them on the chips. That is, the number of transistors and resistors, together with the number of metal signal line interconnections that can be integrated on a chip of given size, is limited by this technology.

Typically, the LSI circuits on the chip embody binary logic for processing binary signals. Since the binary signals may assume only two states, i.e., logic 0 or logic 1, the amount of information on the metal signal line interconnections carrying these signals is limited. If the circuits must process greater amounts of information, the number of metal signal line interconnections must increase.

As an alternative to the use of binary logic on LSI processing circuits, multivalued logic has been considered for implementation on LSI chips. The term "multivalued" is used in the art to mean signals that may assume more than two states, i.e., three or more. For example, a quaternary or 4-valued logic circuit is a circuit that processes a signal that may assume any one of four states of logic 0, logic 1, logic 2 or logic 3. A signal that may assume four states thus contains twice the amount of information of a binary signal which can assume only two states. Consequently, multivalued logic LSI circuits can be implemented with fewer metal signal line interconnections than binary logic circuits, since each metal signal line interconnection can carry signals having more information than binary logic circuits. As a corollary, the same number of metal signal line interconnections may be used on a chip of a given size as for binary logic, but with an increase in signal processing capability.

While conventional multivalued logic circuits have the advantage of reducing the number of metal signal line interconnections that is required for a given LSI circuit, the number of transistors and resistors that are needed to implement the circuit is not necessarily reduced. Therefore, there is still a limitation on the size and complexity of LSI processing circuits that can be integrated on a chip of given size. This is not insignificant since a circuit may require many thousands to tens of thousands of integrated transistors and resistors.

As an example, a synchronous multivalued latch is a memory element that can be used as a component of an LSI circuit. The latch typically has a quantizer stage of transistors and resistors to decode or quantize the value of a multivalued logic-input signal, and a separate storage stage of transistors and resistors to store the quantized value.

Summary of the Invention

It is an object of the invention to be able to implement digital signal processing circuits of increased size and complexity on a chip of a given size.

It is another object of the present invention to be able to reduce the number of transistors, resistors and metal signal line interconnections required to implement digital signal processing circuits on a chip of a given size.

Yet another object of the present invention is to utilize multivalued logic technology to reduce such a number of transistors, resistors and metal signal line interconnections.

These and other objects of the present invention are obtained through the use of a synchronous multivalued latch for storing logical current values of input current having any one of a plurality of multivalues, including quantizer means, having an input and an output, for generating a logical current being a quantization of current being received on the input and for regenerating the received current in response to the logical current to produce a second regenerated current on the output, means for directing the input current to the input of the quantizer means, feedback means for directing the regenerated current from the output to the input of the quantizer means, and clock controlled switch means for decoupling the input current directing means or the feedback directing means from the input to direct the regenerated current or the input current, respectively, to the input as the received current.

BRIEF DESCRIPTION OF THE DRAWINGS

FIG. 1 is a block diagram of the present invention.

FIG. 2 is a schematic illustration of a quantizer of the present invention.

FIG. 3 is a schematic illustration of a clock controlled switch of the present invention.

DETAILED DESCRIPTIION OF THE INVENTION

FIG. 1 shows a multivalued memory element 10 for storing information. In particular, the memory element 10 is a latch, though the principles of the invention have applicability to other types of memory elements. Furthermore, the latch 10 will be specifically described as a synchronous quaternary latch for storing signals that can assume any one of four states or values of logic 0, logic 1, logic 2 or logic 3. However, the term "multivalued" is used conventionally to mean signals that can assume three or more states, i.e., not binary signals.

The latch 10 has an input line 12 that carries a multivalued input current $I_{in}$ which can hve any one of a plurality of vaues of logic 0–logic 3. A quantizer 14 has an input 16 for receiving current $I'_{in}$ from the input line 12. The quantizer 14 decodes or quantizes the value of the current $I'_{in}$ on line 16, regenerates this received current $I'_{in}$ and produces a regenerated current $I''_{in}$ on an output 18 which is the same as current $I_{in}$. A positive feedback line 20 is coupled between the output 18 and the input 16 at a junction 22 to direct the regenerated current $I''_{in}$ to the input 16. Quantizer 14 has another output 24 carrying a stored multivalued current $I_{out}$ that is the same as current $I''_{in}$ and is used for processing by other components of a digital signal processing circuit (not shown).

A clock controlled switch device 26 has a switch 28 coupled to the input line 12 and a switch 30 coupled to the feedback line 20. A clock signal $\emptyset$ and a clock signal $\overline{\emptyset}$ are simultaneously generated to control the switching of switch 28 and switch 30, respectively. When clock signal $\emptyset$ is high, switch 28 is closed to couple the input line 12 directly to the input 16 of quantizer 14. Simultaneously, clock signal $\overline{\emptyset}$ is low to open the switch 30 and decouple the feedback line 20 from the input 16. When clock signal ∅ is low, swtich 28 is opened to decouple input line 12 from input 16 and, simultaneously, clock signal $\overline{\emptyset}$ is high to close switch 30 and directly couple feedback line 20 to input 16.

Thus, when clock signal ∅ is high, the input line 12 directs the input current $I_{in}$ to input 16 as received current $I'_{in}$. When clock signal $\overline{\emptyset}$ is high, feedback line 20 is coupled to input 16 to direct the regenerated current $I''_{in}$ to input 16 as the received current $I'_{in}$. Clock signal ∅ will be high in a setup mode of the latch 10 to direct to the quantizer 14 the input current $I_{in}$ which is to be stored by the latch 10. In this mode, the received current $I'_{in}$, which is the input current $I_{in}$, is decoded or quantized by quantizer 14, with the quantized current being converted to the regenerated current $I''_{in}$ on output 18. Then, in a hold mode, clock signal $\overline{\emptyset}$ goes high to couple the regenerated current $I''_{in}$ to line 16 as received current $I'_{in}$, which is continually being quantized and regenerated by quantizer 14 and produced on output 18. Thus, in the hold mode with the regenerated current $I''_{in}$ being fedback to input 16 and the input line 12 being decoupled from input 16, the input current directed to input 16 during the setup mode is stored statically in the latch 10.

FIG. 2 shows the quantizer 14 having the input 16, the output 18 and the output 24. A voltage generating circuit 32 is connected between voltage $V_{CC}$ and voltage $V_{EE}$ and includes a resistor 34, emitter-follower 36 and a current source 38 which produces or draws a current $I_2$. The emitter-follower 36 includes a transistor 40 having its base coupled to input 16, a transistor 42 and a transistor 44 whose emitter is coupled to a junction 46. The current $I'_{in}$ being received on input 16 is converted by resistor 34 to a voltage of level $V_1$, which is then level shifted down by emitter-follower 36 to form a voltage $V_2$ at junction 46. This voltage $V_2$ thus is proportional to the value of the current $I'_{in}$ being received on input 16.

A thresholded differential pair of transistors 48 includes a transistor 50 and a transistor 52. Transistor 50 has its base coupled to the junction 46 and is biased by voltage $V_2$. The emitter of transistor 50 is coupled to a current source 54 which produces or draws one unit of current $I_1$, while the collector of transistor 50 is coupled to a summing line 56. Transistor 52 has a voltage threshold on its base which is at a reference voltage $V_{R1}$. The emitter of transistor 52 is coupled to the current source 54 and the collector of transistor 52 is coupled to a summing line 58.

A thresholded differential pair of transistors 60 has a transistor 62 and a transistor 64. Transistor 62 has its base coupled to junction 46 and is biased by voltage $V_2$. The emitter of transistor 62 is coupled to a current source 66 which draws one unit of current $I_1$, and the collector of transistor 62 is coupled to the summing line 56 via a summing junction 67. Transistor 64 has a voltage threshold at its base which is at a reference voltage $V_{R2}$, with the emitter being coupled to source 66 and the collector to summing line 58 via a summing junction 68.

Another thresholded differential pair of transistors 70 includes a transistor 72 and a transistor 74. Transistor 72 has its base coupled to the junction 46 and is biased by voltage $V_2$, with its emitter being coupled to a current source 76 that draws one unit of current $I_1$ and its collector being coupled to the summing line 56 via a summing junction 78. Transistor 74 has a voltage threshold on its base which is a reference voltage $V_{R3}$, and its emitter is coupled to the source 76 while the collector is coupled to the summing line 58 via a summing junction 80. Each voltage $V_{R1}$, $V_{R2}$, $V_{R3}$ is at a level distinct from one another to decode or quantize the level of voltage $V_2$ and hence the value of current $I'_{in}$.

As will be shown, a current $I'_{in}$ is produced on summing line 58 that has the same logical value as the current $I'_{in}$ being received on input 16. A current $I'_{in}$, which is the complement of current $\overline{I'_{in}}$, is produced on summing line 56.

A circuit 82 is used to regenerate the received current $I'_{in}$ in response to the complemented current $\overline{I'_{in}}$ on line 56. Circuit 82 has a current source 84 which produces three units of current $I_1$, that is, $3 I_1$. Circuit 82 also includes diodes 86 and a transistor 88 whose emitter is coupled to voltage $V_{EE}$ over a line 90. The summing line 56 is coupled to the source 84 via a junction 91. A transistor 92 is turned on when transistor 88 is turned on, and has its emitter coupled to the line 90 and its collector coupled to the output 18 carrying the regenerated current $I''_{in}$. Another transistor 94 is also turned on when transistor 88 and transistor 92 are turned on, and has its emitter coupled to the line 90, with its collector being coupled to the output 24 to produce current $I_{out}$.

In the operation of quantizer 14, assume that the current $I'_{in}$ being received at input 16 is logic 0, resulting in a voltage $V_2$ at junction 46 which is greater than voltage $V_{R1}$, voltage $V_{R2}$ and voltage $V_{R3}$. Consequently, transistor 50, transistor 62 and transistor 72 will all be turned on. Therefore, source 54 will draw one unit of current $I_1$ on line 56 from source 84 through transistor 50, source 66 will draw one unit of current $I_1$ on line 56 from source 84 through transistor 62 and source 76 will draw one unit of current $I_1$ on line 56 from source 84 through transistor 72. Transistor 52, transistor 64 and transistor 74 will be turned off, so that zero units of current $I_1$ will be drawn on line 58. Consequently, the sum of logical currents $I_1$ on line 58 corresponds to logic 0, which is the same as the assumed current on input 16, while the sum of logical currents $I_1$ on line 56 is three or logic 3, which is the complemented current $\overline{I'_{in}}$.

With the three units of current $I_1$ being drawn from source 84 onto line 56, zero units of current $I_1$ are coupled through diodes 86, whereby transistor 88, transistor 92 and transistor 94 are turned off. Consequently, current $I''_{in}$ on output 18 and current $I_{out}$ on output 24 are the same as the received current $I'_{in}$ at input 16 or logic 0.

In a similar manner the quantizer 14 can quantize the value of the current $I'_{in}$ at input 16 having values of logic 1-3. As another example, assume that the current $I'_{in}$ at input 16 has a value of logic 2. The resulting voltage $V_2$ produced at junction 46 will be less than voltage $V_{R1}$ and $V_{R2}$, but greater than voltage $V_{R3}$. Therefore, transistor 52, transistor 64 and transistor 72 will be turned on, while transistor 50, transistor 62 and transistor 74 will be turned off. As a result, source 54 will draw one unit of current $I_1$ on line 58 through transistor 52 and source 66 will draw one unit of current $I_1$ on line 58 through transistor 64 to produce a summed current $I'_{in}$ having a value of logic 2. Source 76 will draw one unit of current $I_1$ on line 56 through transistor 72 to produce a summed current $\overline{I'_{in}}$ on line 56 having a value of logic 1.

Since one unit of current $I_1$ is drawn from source 84 onto line 56 via junction 91, the remaining two units of current $I_1$ are directed from source 84 through diodes 86 to turn on transistor 88, resulting in transistor 92 and transistor 94 also being turned on and two units of current each being drawn through transistor 92 and transistor 94. Consequently, current $I''_{in}$ and current $I_{out}$ at output 18 and output 24 have a value of logic 2, corresponding to the current $I'_{in}$ being received at input 16. In a similar manner, currents $I'_{in}$ being received at input 16 of logic 1 or logic 3 can be regenerated as current $I''_{in}$ at output 18 and current $I_{out}$ at output 24 of a similar value.

FIG. 3 illustrates the clock controlled switch 26 in which the switch 28 is a differential pair of transistors 96 having a transistor 98 and a transistor 100. Switch 30 is a differential pair of transistors 102 having a transistor 104 and a transistor 106.

Transistor 98 has its emitter coupled to input line 12 and its collector coupled to input 16 of quantizer 14. The clock signal $\emptyset$ is coupled to the base of transistor 98 to turn on transistor 98. Transistor 100 has its emitter coupled to input line 12 and its collector coupled away from input 16 to source $V_{CC}$. Transistor 100 is turned on by the clock signal $\emptyset$ which is coupled to its base.

Transistor 104 has its emitter coupled to feedback line 20 and its collector coupled to input 16 via junction 22. Transistor 104 is biased at its base by clock signal $\emptyset$. Transistor 106 has its emitter coupled to feedback line 20 and its collector coupled away from input 16 to source $V_{CC}$. The clock signal $\emptyset$ is coupled to the base of transistor 106 to turn on transistor 106.

In the operation of switch 26, when the clock signal $\emptyset$ is high, transistor 98 and transistor 106 are turned on. Consequently, input line 12 is directly coupled through transistor 98 and junction 22 to input 16 to direct or draw input current $I_{in}$ onto input 16 as current $I'_{in}$. Simultaneously, feedback line 20 is decoupled from input 16 since transistor 104 is turned off, and is coupled to source $V_{CC}$ via transistor 106. When clock signal $\emptyset$ is high, transistor 100 and transistor 104 are turned on, while transistor 98 and transistor 106 are turned off. With transistor 98 being turned off and transistor 100 being turned on, input line 12 is decoupled from input 16 to direct or draw input current $I_{in}$ through transistor 100 from source $V_{CC}$. Simultaneously, with transistor 104 being turned on and transistor 106 being turned off, feedback line 20 is directly coupled to input 16 via junction 22 to direct the regenerated current $I''_{in}$ through transistor 104 and junction 22 to input 16 as current $I'_{in}$.

In the overall operation of latch 10, assume that an input current $I_{in}$ of any one of the multivalues is on input line 12 and is to be stored in latch 10. The latch 10 is placed in a setup mode by making clock signal $\emptyset$ high and clock signal $\emptyset$ low. Consequently, input current $I_{in}$ is directed to input 16 and any current $I''_{in}$ on line 20 is directed away from input 16. Quantizer 14 then quantizes the current $I'_{in}$ using the differential pairs of transistors 48, 60 and 70, and regenerates this current $I'_{in}$ to produce the regenerated current $I''_{in}$ at output 18.

Then, latch 10 is placed in a hold mode by making clock signal $\emptyset$ high and clock signal $\emptyset$ low. The regenerated current $I''_{in}$ is fedback over line 20 and directed to input 16 as current $I'_{in}$, while any other input current $I_{in}$ being received on input line 12 is directed away from input 16. Thus, as long as latch 10 is in the hold mode, the original input current $I_{in}$ is statically stored in quantizer 14 on line 58 and is regenerated at output 18 as well as output 24.

In summary, the latch 10, being a multivalued logic memory element, can process a greater amount of information than a comparable binary logic memory element, thereby reducing the number of metal signal line connections needed for a given digital processing circuit on a chip of a given size. Moreover, the thresholded pairs of differential transistors 48, 60 and 70 not only quantize the current at input 16, but also statically store the current on summing line 58 as well as summing line 56. Since these pairs of transistors perform this dual function, no additional transistors and resistors are needed as are required in prior latches using transistors and resistors to perform the quantization function and other transistors and resistors to perform the storage function.

Furthermore, the input current $I_{in}$ and regenerated current $I''_{in}$ are directly coupled to input 16 through simple clock controlled switch 28 in the input line 12 and clock controlled switch 30 in the feedback line 20, which switches require only a few transistors to implement. Also, since the feedback line 20 is opened by switch 30 in the setup mode, any transients that might appear on line 20 will not affect the input current $I_{in}$ so that the proper data can be stored in latch 10. Also, since the latch 10 operates on current signals, less power is required than if voltage signals were being processed.

Other aspects, objects and advantages of this invention can be obtained from a study of the drawings, the disclosure and the appended claims.

I claim:
1. A synchronous multivalued latch for storing logical current values of a first input current having any one of a plurality of multivalues, comprising:
   (a) quantizer means, having an input and an output, for generating a logical current being a quantization of current being received at said input and for regenerating the received current in response to the logical current to produce a second regenerated current at said output;
   (b) first means for directing the first input current to said input of said quantizer means;
   (c) second feedback means for directing the second regenerated current from said output to said input of said quantizer means; and
   (d) clock controlled switch means for decoupling said first directing means or said second feedback directing means from said input of said quantizer means to direct the second regenerated current or the first input current, respectively, to said input of said quantizer means as the received current.

2. A synchronous multivalued latch according to claim 1 wherein said quantizer means comprises:
   (a) a plurality of means for individually detecting the level of the received current at said input of said quantizer means and for generating individual logical currents;
   (b) means for summing the individual logical currents to produce a summed logical current representing the value of the first input current; and
   (c) means for converting the summed logical current to the second regenerated current.

3. A synchronous multivalued latch according to claim 2 wherein said plurality of means for individually detecting comprises:
   (a) means for converting the received current at said input to a voltage; and (b) a plurality of means, each having a distinct voltage threshold, for comparing the voltage to each said distinct voltage threshold.

4. A synchronous multivalued latch according to claim 3 wherein said plurality of means for comparing each comprises a threshold differential pair of transistors, one of said transistors being biased by the voltage and the other of said transistors having the distinct voltage threshold.

5. A synchronous multivalued latch according to claim 1 wherein said clock controlled switch means comprises:
(a) a first pair of transistors being coupled to said first directing means;
(b) a second pair of transistors being coupled to said second feedback directing means; and
(c) means for clocking said first pair of transistors and said second pair of transistors to transfer the first input current to said input of said quantizer means while transferring the second regenerated current away from said input and for clocking said first pair of transistors and said second pair of transistors to transfer the second regenerated current to said input while transferring the first input current away from said input.

6. A synchronous multivalued latch according to claim 5 wherein:
(a) said first pair of transistors comprises a first differential pair having first and second transistors;
(b) said second pair of transistors comprises a second differential pair having third and fourth transistors; and
(c) said means for clocking generates clock pulses to turn on said first and fourth transistors while turning off said second and third transistors and clock pulses to turn on said second and third transistors while turning off said first and fourth transistors.

7. A synchronous quadra-stable latch for storing logical current values of first input current having any one of four values, comprising:
(a) a quantizer having an input for receiving current, a first output, a second output, means for converting the received current at said input to a voltage proportional to the received current, first means, having a first voltage threshold, for comparing the voltage to the first voltage threshold to generate first uncomplemented and complemented logical currents, second means, having a second voltage threshold, for comparing the voltage to the second voltage threshold to generate second uncomplemented and complemented logical currents, third means, having a third voltage threshold, for comparing the voltage to the third voltage threshold to generate third complemented and uncomplemented logical currents, first means for summing the first, second and third uncomplemented logical currents to produce a summed uncomplemented logical current, second means for summing the first, second and third complemented logical currents to produce a summed complemented logical current, and means for converting the summed complemented logical current to a second regenerated current corresponding to the received current at said input and for producing the second regenerated current at said first output and said second output;
(b) first means for directing the first input current to said input;
(c) second feedback means for directing the second regenerated current at said first output to said input; and
(d) clock controlled switch means for coupling said first directing means to said input while decoupling said second feedback directing means from said input and for coupling said second feedback directing means to said input while decoupling said first detecting means from said input.

8. A synchronous quadra-stable latch according to claim 7 wherein said first, second and third means for comparing each comprises a thresholded differential pair of transistors, one of said transistors being biased by the voltage and the other of said transistors having one of the voltage thresholds, and wherein said one transistor is coupled to said second summing means and said other transistor is coupled to said first summing means.

9. A synchronous quadra-stable latch according to claim 8 wherein said means for converting the received current to a voltage comprises:
(a) means for generating a first voltage in response to the received current; and
(b) emitter-follower transistor means for reducing the first voltage to a second voltage.

10. A synchronous quadra-stable latch according to claim 8 wherein said clock controlled switch means comprises:
(a) a first pair of first and second transistors for transferring the input current to or away from said input;
(b) a second pair of third and fourth transistors for transferring the second regenerated current to or away from said input; and
(c) means for generating clock pulses to turn on said first and fourth transistors while turning off said second and third transistors and for generating clock pulses to turn on said second and third transistors while turning off said first and fourth transistors.

* * * * *

UNITED STATES PATENT AND TRADEMARK OFFICE
CERTIFICATE OF CORRECTION

PATENT NO. : 4,378,595

DATED : March 29, 1983

INVENTOR(S) : Karl W. Current

It is certified that error appears in the above-identified patent and that said Letters Patent is hereby corrected as shown below:

Column 8, line 23, "detecting" should be "directing".

Signed and Sealed this

Ninth Day of August 1983

[SEAL]

Attest:

GERALD J. MOSSINGHOFF

Attesting Officer   Commissioner of Patents and Trademarks